(12) United States Patent
Kimura

(10) Patent No.: US 6,384,689 B1
(45) Date of Patent: May 7, 2002

(54) PREAMPLIFIER FOR OPTICAL RECEIVERS

(75) Inventor: Hiroshi Kimura, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/689,836

(22) Filed: Oct. 13, 2000

(30) Foreign Application Priority Data

Oct. 15, 1999 (JP) .............................................. 11-293293

(51) Int. Cl.[7] .............................. H03F 3/08; H03F 1/36; H03G 3/30; H01J 40/14
(52) U.S. Cl. ........................ 330/308; 330/86; 330/110; 330/282; 250/214 A
(58) Field of Search .......................... 330/86, 110, 282, 330/308; 250/214 A

(56) References Cited

U.S. PATENT DOCUMENTS 3,736,520 A * 5/1973 Acker
4,935,702 A * 6/1990 Mead et al.
6,028,482 A * 2/2000 Herrle
6,163,219 A * 12/2000 Kanasugi

OTHER PUBLICATIONS

"A 156–Mb/s CMOS Optical Receiver for Burst–Mode Transmission" by Nakamura et al., IEEE Journal of Solid–State Circuits, vol. 33, No. 8 (Aug. 1998), pp. 1179–1187.

* cited by examiner

*Primary Examiner*—Robert Pascal
*Assistant Examiner*—Patricia T. Nguyen
(74) *Attorney, Agent, or Firm*—McDermott, Will & Emery

(57) ABSTRACT

In a preamplifier for optical receivers, the input of an inverting amplifier is connected to an input terminal, the output of the inverting amplifier is connected to the gate of a first transistor, the source of the first transistor and the source of a second transistor are connected to a first bias member, the drain of the first transistor and the gate of the second transistor are connected to a first load member, the drain of the second transistor is connected to a second load member and an output terminal, and a feedback resistor is connected between the input and output terminals. With this configuration, a stable, low-power, wide-band transimpedance amplifier is provided without the necessity of special phase compensation.

18 Claims, 7 Drawing Sheets

PREAMPLIFIER FOR OPTICAL RECEIVERS

BACKGROUND OF THE INVENTION

The present invention relates to a preamplifier mainly for an optical communication system, disposed at the front end of an optical signal receiver circuit for converting a current signal from a photodiode to a voltage signal.

In an optical communication system, a preamplifier used in an optical signal receiver section has a function of converting a current signal supplied from a photodiode to a voltage signal. The current signal originates from an optical signal transmitted through an optical fiber. In general, a transimpedance amplifier is used as such a preamplifier.

A transimpedance amplifier is composed of an inverting amplifier and a feedback resistor Rf connected in parallel with the inverting amplifier between the input and output thereof. The 3 dB attenuation band $f_{-3\,dB}$ of transimpedance gain of a transimpedance amplifier is represented by:

$$f_{-3\,dB} = (1+A)/2(Rf \times Cin)$$

where A denotes the open gain of the inverting amplifier, Rf denotes the resistance of the feedback resistor, and Cin denotes the parasitic input capacitance at the input terminal of the inverting amplifier. From the above equation, it is found that to broaden the band of the transimpedance amplifier, the open gain A of the inverting amplifier must be increased.

Setting a high open gain A, however, fails to secure the band of the inverting amplifier itself. For this reason, it is quite difficult to attain a wide-band transimpedance amplifier with a single-stage inverting amplifier. Therefore, in general, an odd number of stages (normally, three stages) of low-gain, wide-band inverting amplifiers are put in cascade connection, to thereby obtain high gain and thus attain a wide-band transimpedance amplifier.

The conventional multistage configuration described above has a drawback that the phase largely rotates and thus a sufficient phase margin is not obtainable. To obtain stable characteristics, therefore, a phase compensation means of some type is required. One example of such a means is described in M. Nakamura et al, "A 156-Mb/s CMOS Optical Receiver for Burst-Mode Transmission", IEEE Journal of Solid-State Circuits, Vol. 33, No. 8, pp. 1179–1187, August 1998, where three-stage inverting amplifiers are cascaded and feed-forward compensation is adopted for suppressing phase rotation.

In the conventional multistage configuration, three stages or more are generally required as described above. This not only increases power consumption, but also increases the chip area since passive elements such as capacitors and resistors are required for phase compensation.

SUMMARY OF THE INVENTION

An object of the present invention is providing a stable, low-power, wide-band transimpedance amplifier without the necessity of special phase compensation.

To attain the above object, a preamplifier according to the present invention has a configuration that the input of an inverting amplifier is connected to an input terminal, the output of the inverting amplifier is connected to the gate of a first transistor, the source of the first transistor and the source of a second transistor are connected to a first bias member, the drain of the first transistor and the gate of the second transistor are connected to a first load member, the drain of the second transistor is connected to a second load member and an output terminal, and a feedback resistor is connected between the input and output terminals.

An optical communication unit according to the present invention includes an optical receiver section for converting an optical signal transmitted through an optical fiber to a current signal by means of a photodiode to extract receiving data. The optical receiver section includes the preamplifier described above that converts the current signal to a voltage signal.

An optical detector according to the present invention includes the preamplifier described above. The optical detector is configured to convert a received optical signal to a current signal by means of a photodiode and then convert the current signal to a voltage signal by means of the preamiplifier.

DETAILED DESCRIPTION OF THE INVENTION

Hereinafter, preferred embodiments of the present invention will be described with reference to the accompanying drawings.

EMBODIMENT 1

Figure 1:
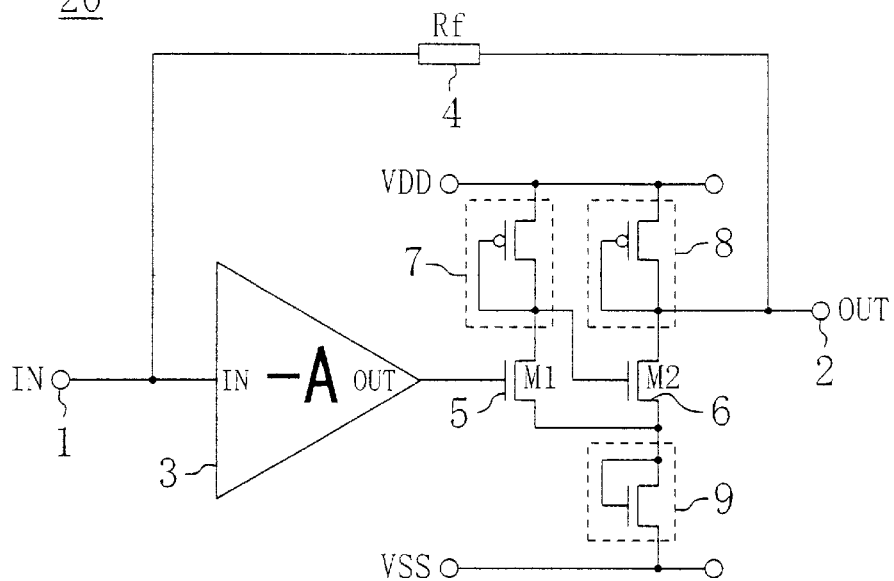
FIG. 1 is a circuit diagram of a preamplifier for optical receivers of EMBODIMENT 1 of the present invention.

FIG. 1 illustrates a preamplifier for optical receivers of EMBODIMENT 1 of the present invention. Referring to FIG. 1, a preamplifier 20 includes an input terminal (IN) 1, an output terminal (OUT) 2, an inverting amplifier 3, a feedback resistor (Rf) 4, a first transistor (M1) 5, a second transistor (M2) 6, a first load member 7, a second load member 8, and a first bias member 9. VDD and VSS represent power supplies. In this embodiment, NMOS transistors are used as the first and second transistors 5 and 6.

The sources of the first and second transistors 5 and 6 are connected with each other, and biased by the first bias member 9 that is a constant current source. The drains of the first and second transistors 5 and 6 are connected with the first and second load members 7 and 8, respectively.

Each of the first and second load members 7 and 8 is composed of a PMOS transistor of which the drain and gate are connected with each other. The first bias member 9 is composed of an NMOS transistor of which the drain and gate are connected with each other. The gate of the first transistor 5 is connected to the output of the inverting amplifier 3, and the gate of the second transistor 6 is connected to a connection point between the first transistor 5 and the first load member 7. The feedback resistor 4 is disposed between the input terminal 1 and the output terminal 2.

Referring to FIG. 1, the first transistor 5, the second transistor 6, the first load member 7, the second load member 8, and the first bias member 9 constitute a noninverting amplifier. Thus, this noninverting amplifier and the inverting amplifier 3 in cascade connection constitute a two-stage inverting amplifier.

Accordingly, in this embodiment, it is possible to construct a high-gain inverting amplifier with the number of stages that is small by one than the minimum number of stages, i.e., three stages, required for the multistage inverting amplifier. As a result, a stable, wide-band transimpedance amplifier can be easily obtained without the necessity of special phase compensation.

With the reduction in the number of stages by one, power consumption can be reduced. In addition, in this embodiment, the gate of the second transistor 6 is connected to the drain of the first transistor 5, i.e., the first load member 7. This indicates that signals of opposite phases are input into the gates of the first and second transistors 5 and 6. This enables a higher gain to be obtained easily compared with the operation of a normal differential circuit.

Since the transistor of which the drain and gate are connected with each other is used as the load members 7 and 8, the gain of the noninverting amplifier is determined based on the gm ratio of the transistor. This allows for further stable operation against process variation.

Since the constant current source is used as the first bias member 9, further stable operation is ensured against variation in supply voltage. In addition, the transistor of which the drain and gate are connected with each other is actually used as the first bias member 9 as described above. This makes it possible to provide the effect as the bias member by a configuration considerably easy to obtain without the necessity of application of a bias voltage and the like.

EMBODIMENT 2

Figure 2:
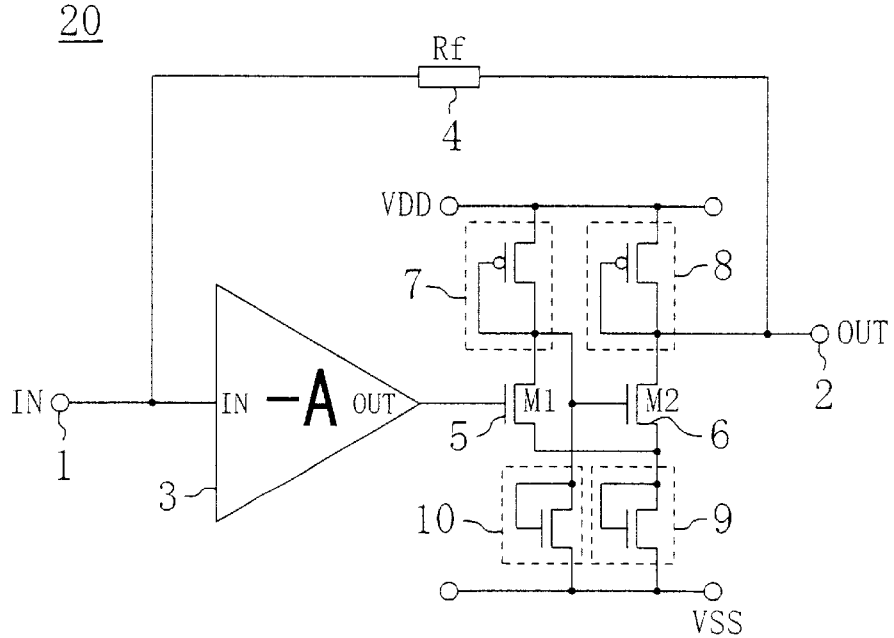
FIG. 2 is a circuit diagram of a preamplifier for optical receivers of EMBODIMENT 2 of the present invention.

FIG. 2 illustrates a preamplifier for optical receivers of EMBODIMENT 2 of the present invention. In FIG. 2, the same components as those in FIG. 1 are denoted by the same reference numerals, and the description thereof is omitted here.

The preamplifier in FIG. 2 is provided with a second bias member 10 that is connected to the first load member 7. In other words, the first load member 7 is biased by the second bias member 10. The second bias member 10 is composed of an NMOS transistor of which the drain and gate are connected with each other.

With the above configuration, the first load member 7 is biased at all times irrespective of the gate voltage of the first transistor 5. Therefore, the amplitude of the signal applied to the gate of the second transistor 6 is narrowed, and thus further stable operation is realized.

A constant current source is used as the second bias member 10. This ensures further stable operation against variation in supply voltage. Moreover, the transistor of which the drain and gate are connected with each other is actually used as the second bias member 10 as described above. This makes it possible to provide the effect as the bias member by a configuration considerably easy to obtain without the necessity of application of a bias voltage and the like.

EMBODIMENT 3

Figure 3:
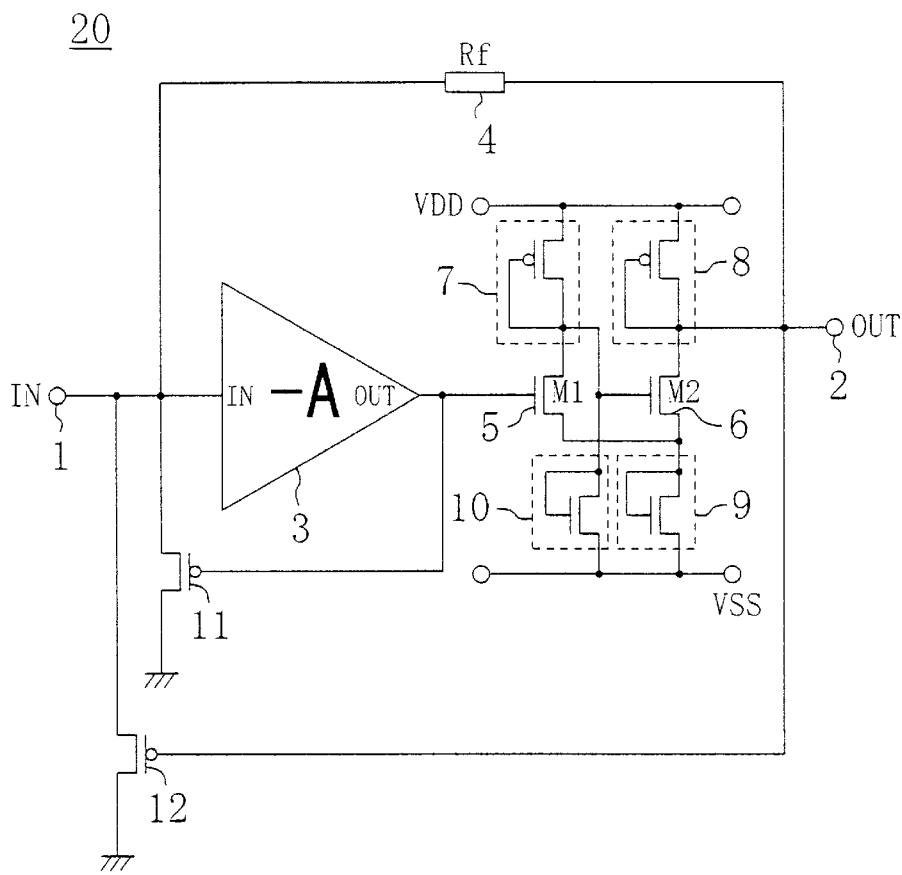
FIG. 3 is a circuit diagram of a preamplifier for optical receivers of EMBODIMENT 3 of the present invention.

FIG. 3 illustrates a preamplifier for optical receivers of EMBODIMENT 3 of the present invention. In FIG. 3, the same components as those in FIG. 2 are denoted by the same reference numerals, and the description thereof is omitted here.

If it is desired to detect a small signal in a transimpedance amplifier, the resistance of the feedback resistor 4 must be made high. However, if the resistance of the feedback resistor 4 is set at a high value, the output voltage will be saturated when a large amount of current is input, resulting in failure in normal current-voltage conversion.

To solve the above problem, the preamplifier in FIG. 3 is provided with: a PMOS shunting transistor 11 that has a gate connected to the output of the inverting amplifier 3, a source connected to the input terminal 1, and a drain connected to the ground; and a PMOS shunting transistor 12 that has a gate connected to the output terminal 2, a source connected to the input terminal 1, and a drain connected to the ground.

Figure 4:
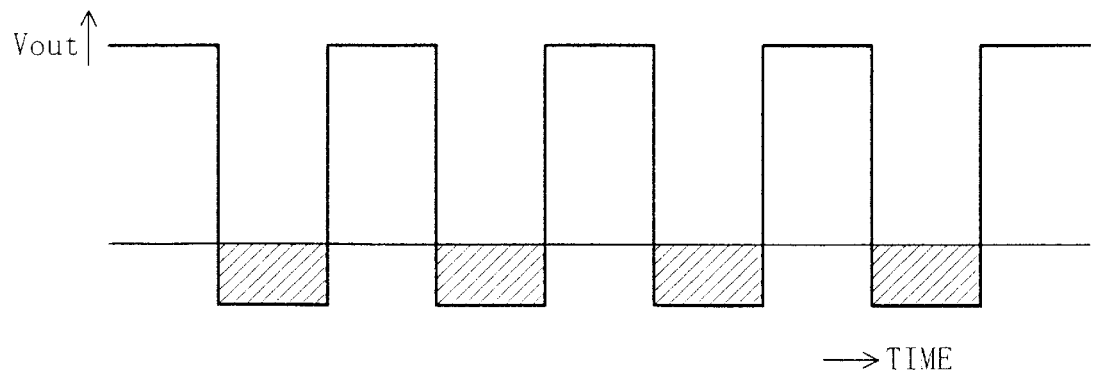
FIG. 4 is a view illustrating an output amplitude narrowing effect in EMBODIMENT 3.

With the above configuration, when the input current signal is small, the shunting transistors 11 and 12 are in the cut-off state. Once the input signal becomes so large that the output voltage of the inverting amplifier 3 or the output voltage of the output terminal 2 exceeds the threshold voltage of the shunting transistor 11 or 12, the shunting transistor is turned ON allowing part of the input current to be shunted to the ground and thereby reducing the current flowing to the feedback resistor 4. By this shunting, the hatched portions of the waveform of the output voltage Vout shown in FIG. 4 are cut, and thus saturation of the output voltage Vout can be significantly suppressed.

As a result, normal current-voltage conversion becomes possible for a larger input signal, and thus the dynamic range of the input signal is widened.

The above effect can also be obtained by providing only one of the shunting transistors 11 and 12.

EMBODIMENT 4

Figure 5:
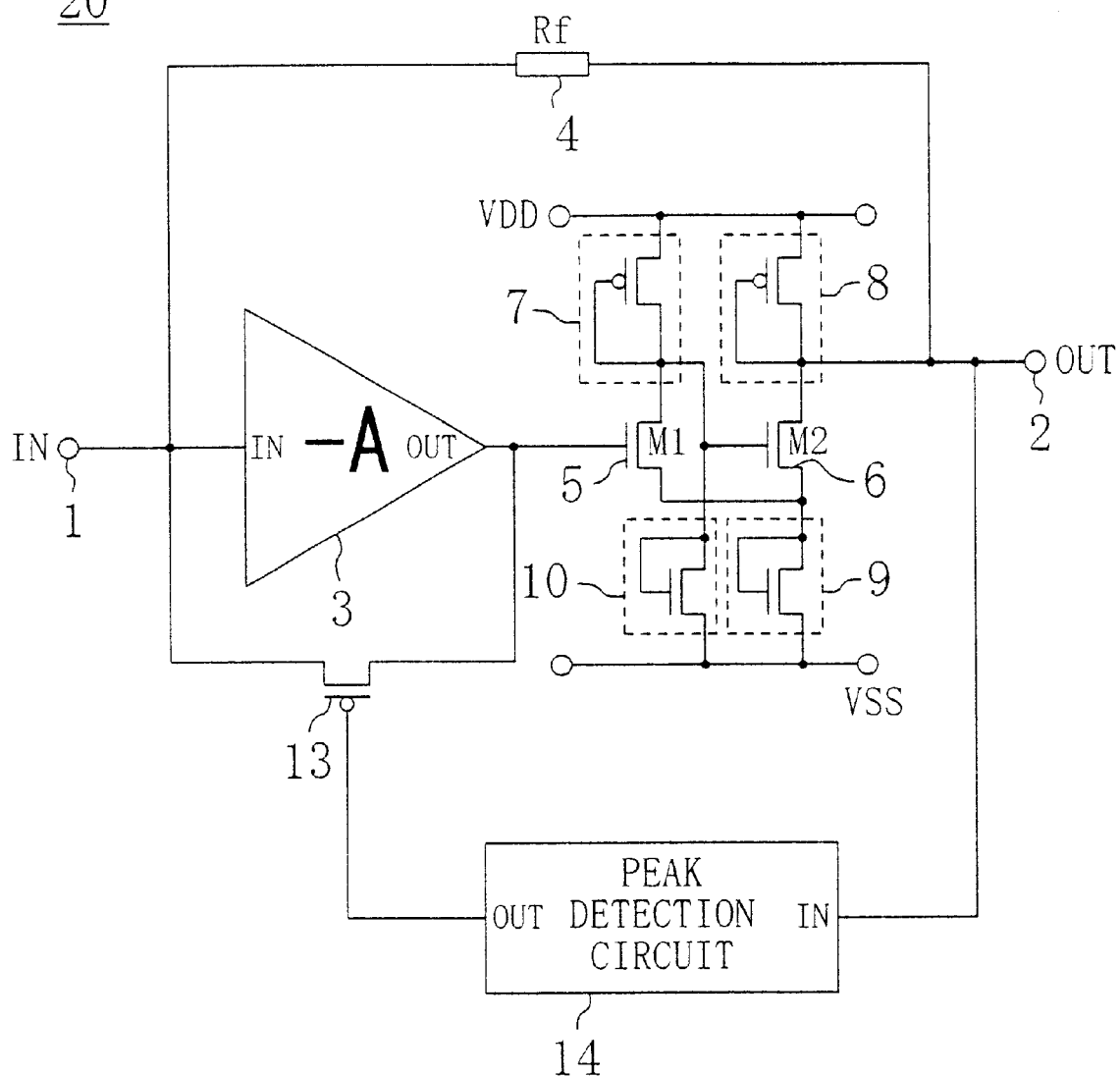
FIG. 5 is a circuit diagram of a preamplifier for optical receivers of EMBODIMENT 4 of the present invention.

FIG. 5 illustrates a preamplifier for optical receivers of EMBODIMENT 4 of the present invention. In FIG. 5, the same components as those in FIG. 2 are denoted by the same reference numerals, and the description thereof is omitted here.

The preamplifier shown in FIG. 3 described above is configured so that the bottom portion of the waveform of the output voltage Vout is cut when a large current is input. This causes a problem when an optical signal having a small optical on-off ratio is received. To state more specifically, in high-speed optical communication, in order to attain high-speed switching of a laser from OFF to ON on the transmitter side, the laser is not completely cut off during the OFF state, but is biased with some level of current, keeping light being emitted from the laser.

Figure 6A:
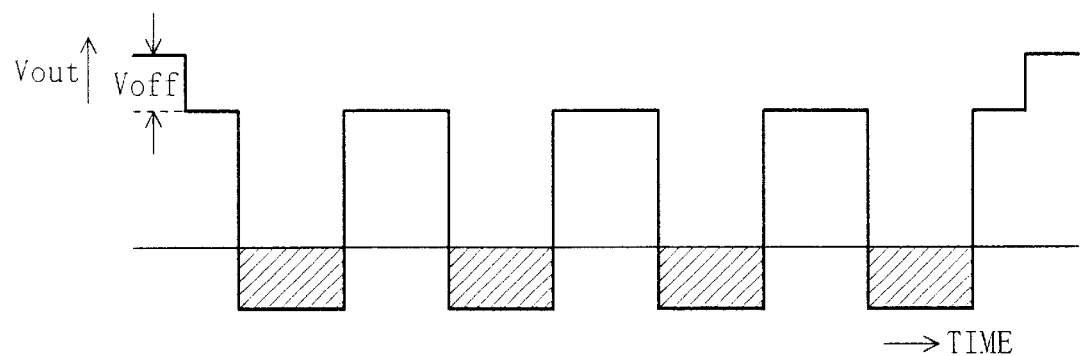
FIGS. 6A, and 6B are views illustrating an output amplitude narrowing effect in EMBODIMENT 4.

The waveform of the output voltage Vout in the above case has an offset by Voff as shown in FIG. 6A. If the bottom portion of such a waveform is cut, the signal amplitude component becomes very small, and this makes it difficult to extract data in a later stage (see FIG. 6A).

In order to solve the above problem, the preamplifier shown in FIG. 5 is provided with: a PMOS shunting transistor 13 connected in parallel with the inverting amplifier 3 between the input and output thereof; and a peak detection circuit 14 having an input connected to the output terminal 2 and an output connected to the gate of the PMOS shunting transistor 13.

Figure 6B:
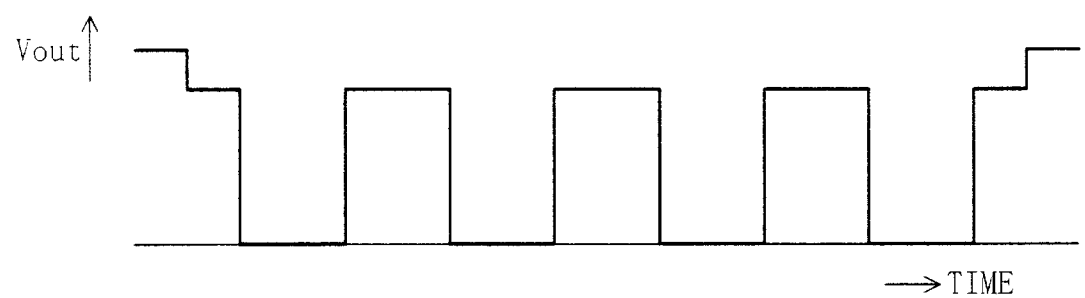

With the above configuration, the output voltage Vout has a waveform as if the entire output waveform is compressed at a certain ratio as shown in FIG. 6B, not the waveform of which the bottom portion is cut. This prevents the signal amplitude component from being extremely reduced and thus suppresses saturation of the output voltage Vout. As a result, an optical signal having a small optical on-off ratio can be received without causing any trouble.

EMBODIMENT 5

Figure 7:
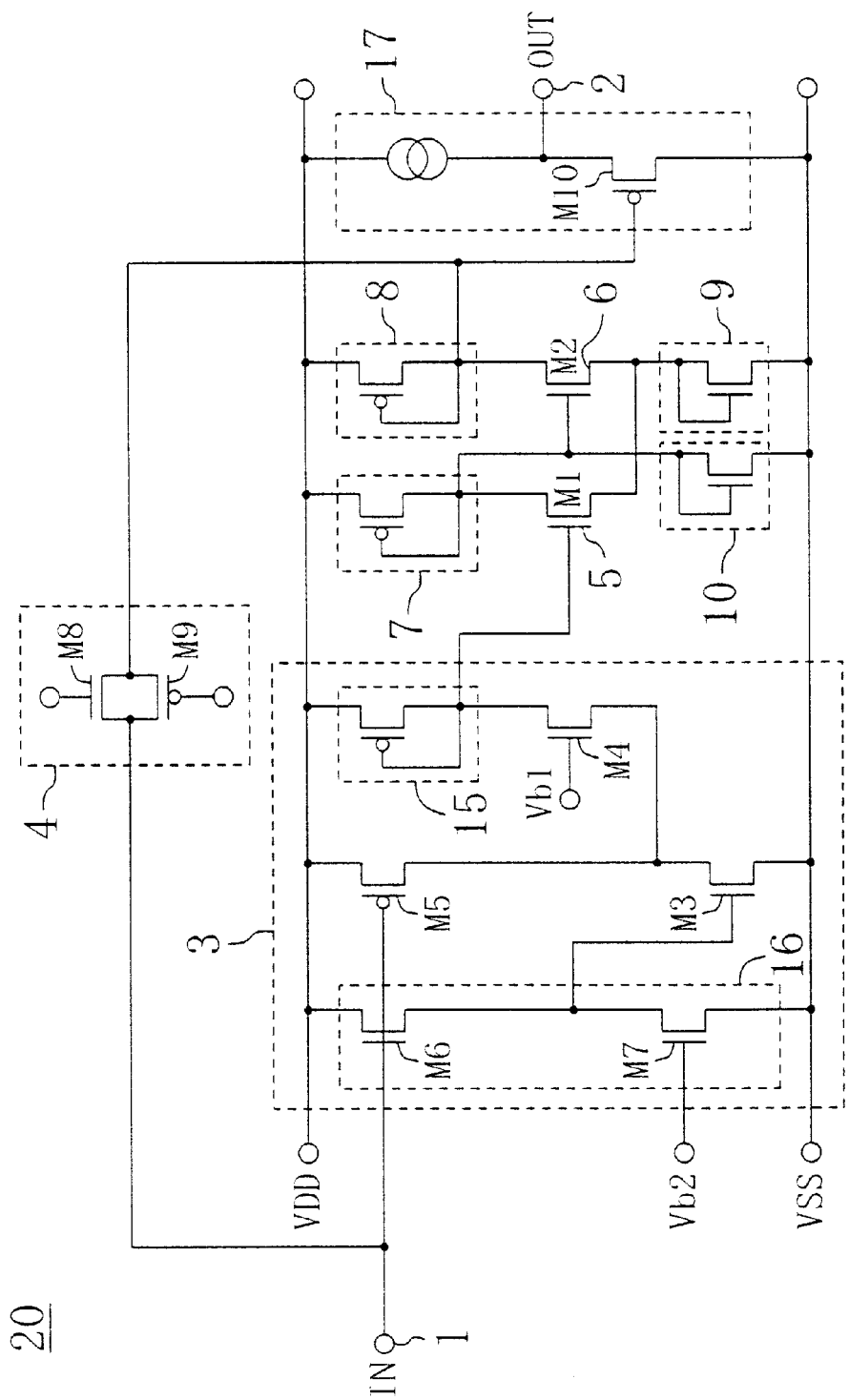
FIG. 7 is a circuit diagram of a preamplifier for optical receivers of EMBODIMENT 5 of the present invention.

FIG. 7 illustrates a preamplifier for optical receivers of EMBODIMENT 5 of the present invention. In FIG. 7, the same components as those in FIG. 2 are denoted by the same reference numerals, and the description thereof is omitted here.

The inverting amplifier 3 in FIG. 7 includes NMOS transistors M3 and M4 as the third and fourth transistors, a PMOS transistor M5 as the fifth transistor, a third load member 15, and a level shift t circuit 16. Vb1 denotes a gate bias voltage of the transistor M4. The third load member 15 is composed of a PMOS transistor of which the drain and gate are connected with each other. The level shift circuit 16 includes NMOS transistors M6 and M7 as the sixth and seventh transistors. Vb2 denotes a gate bias voltage of the seventh transistor M7. The gate of the transistor M5 and the input of the level shift circuit-16 are connected to the input terminal 1. The gate of the transistor M3 is connected to the output of the level shift circuit 16. The drains of the transistors M3 and M5 are connected to the source of the transistor M4 that receives the bias voltage Vb1 at the gate thereof. The drain of the transistor M4 is connected to the third load member 15.

The feedback resistor 4 is constructed of an NMOS transistor M8 as the eighth transistor and a PMOS transistor M9 as the ninth transistor. The output terminal 2 is provided with a source follower 17 as a buffer circuit including a PMOS transistor M10 as the tenth transistor.

With the above configuration, the gm of the input stage can be enhanced owing to the complementary operation of the third transistor M3 and the fifth transistor MS, and thus the gain of the inverting amplifier 3 can be easily increased. In general, as for equivalent noise referred to input in a multistage amplifier, if the gain of the first-stage amplifier is high, influence of the noise in the second and subsequent stages can be reduced. Thus, a low-noise amplifier is obtained. In this embodiment, since the gain of the inverting amplifier 3 as the first stage can be easily set at a high value, excellent noise characteristics are obtained.

In this embodiment, most of the current flowing to the transistor M3 is supplied from the transistor M5, whereby the current flowing to the third load member 15 is reduced. With this configuration, saturation at the output of the inverting amplifier 3 is avoided while a large current flows to the transistors M3 and M5 realizing high gain and low noise.

The gate voltage of the transistor M3 has been level-shifted from the voltage at the input terminal 1, whereby the transistor M3 is prevented from being involved in a linear region, and thus further stable high-frequency characteristics are obtained. In addition, the amount of the bias current flowing to the transistors M3 and M5 can be easily controlled based on the level shift amount provided by the level shift circuit 16.

Since the level shift circuit 16 is constructed of a source follower, level shifting can be performed with a configuration easy to obtain.

Since the third load member 15 is constructed of a transistor of which the drain and gate are connected with each other, the gain of the inverting amplifier 3 is determined based on the gm ratio of the transistor. This allows for further stable operation against process variation.

Since the feedback resistor 4 is constructed of transistors, a larger resistance is obtained in a smaller area.

Since the output terminal 2 is provided with a source follower as a buffer circuit, driving of a larger load is possible.

(Embodiments of optical communication unit and optical detector)

An optical communication unit and an optical detector using any of the preamplifiers for optical receivers described above will be described.

Figure 8:
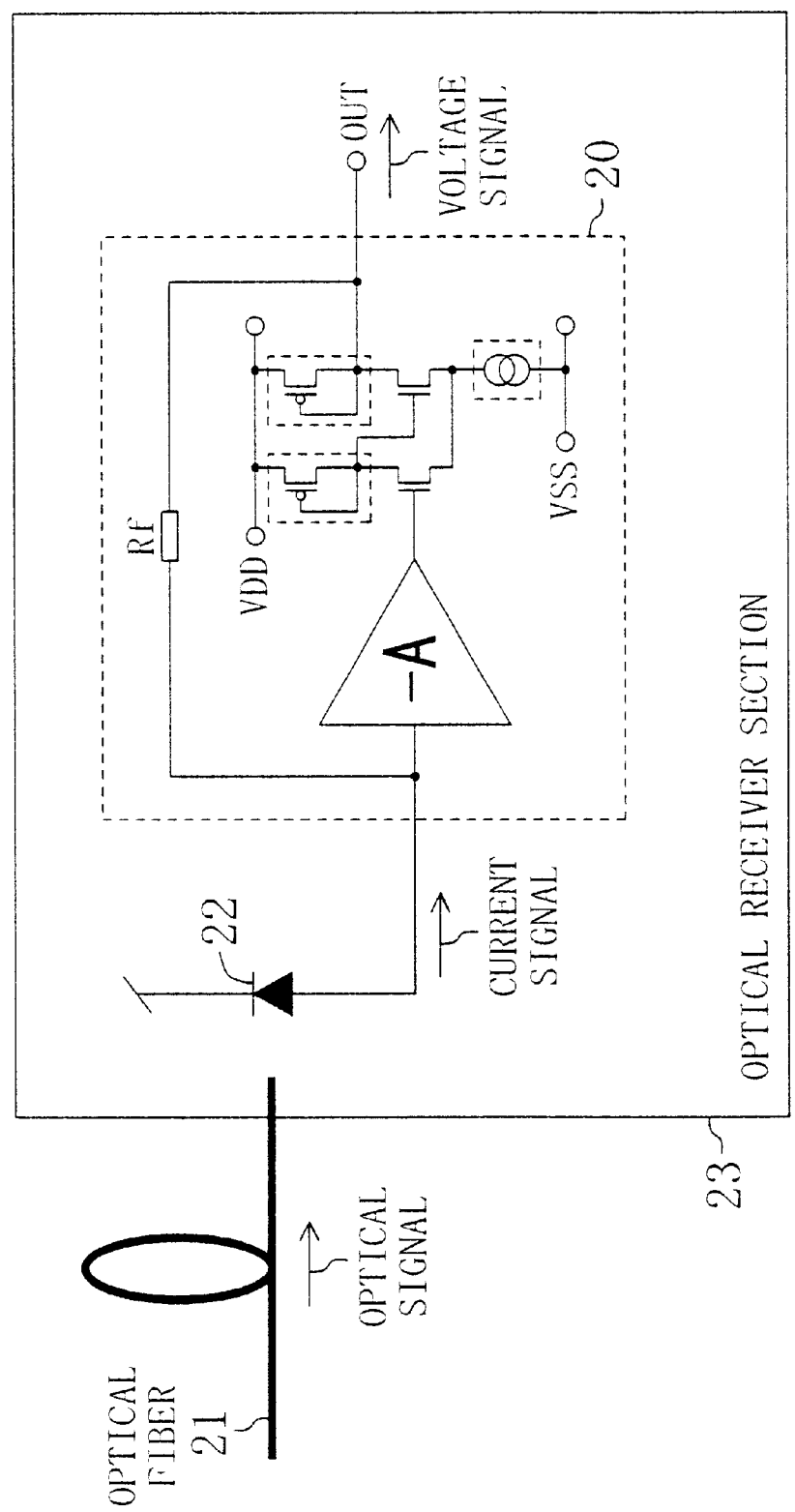
FIG. 8 is a circuit diagram of an optical communication unit of the present invention.

FIG. 8 illustrates a basic configuration of an optical communication unit. The optical communication unit includes an optical receiver section 23, where an optical signal transmitted through an optical fiber 21 is converted to a current signal by means of a photodiode 22 for extracting received data. The optical receiver section 23 includes a preamplifier 20, which converts the current signal to a voltage signal. The preamplifier 20 may be of any of the configurations shown in FIGS. 1, 2, 3, 5, and 7.

Figure 9:
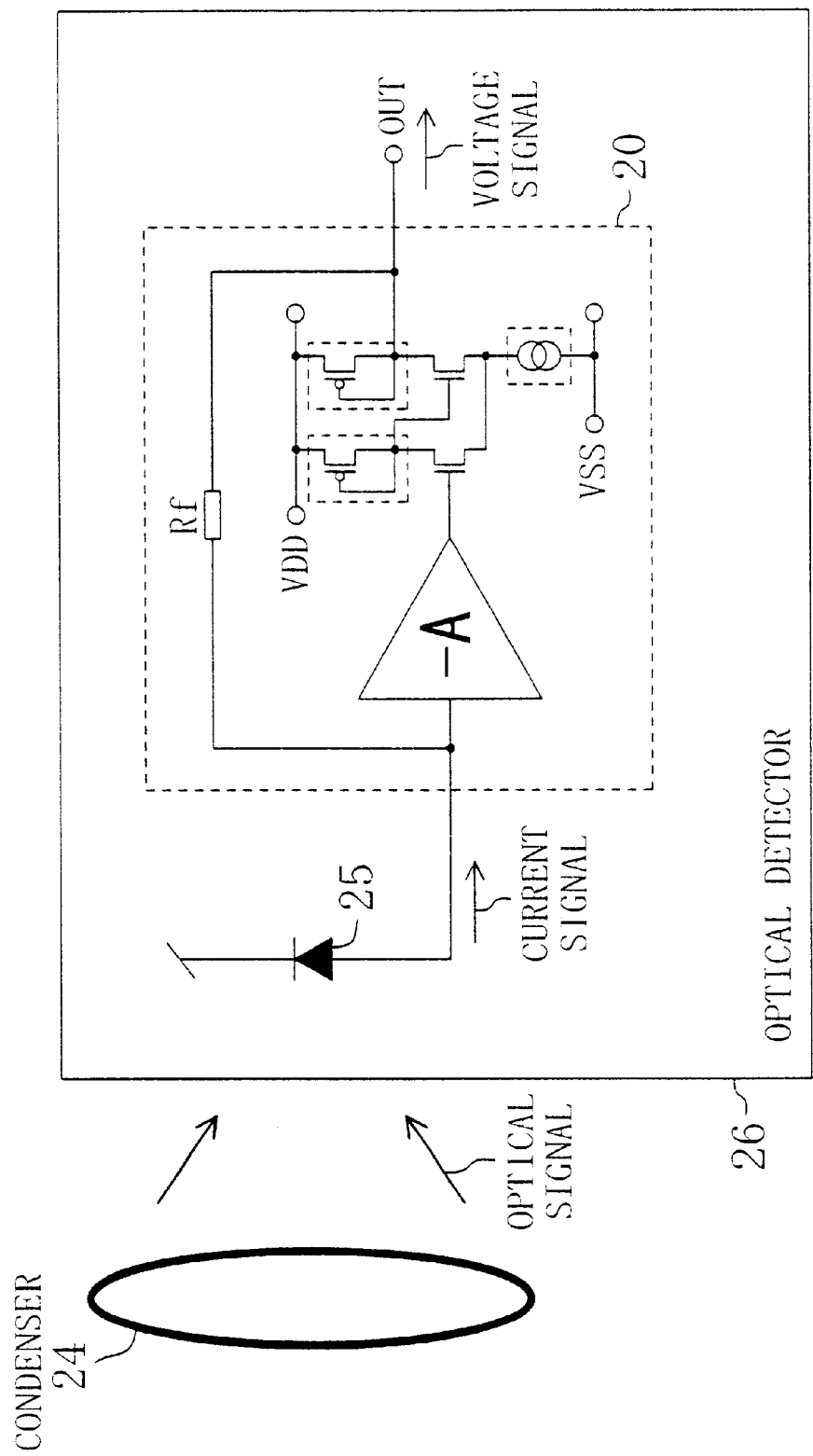
FIG. 9 is a circuit diagram of an optical detector of the present invention.

FIG. 9 illustrates a basic configuration of an optical detector 26 that includes a photodiode 25 and a preamplifier 20. An optical signal received via a condenser 24 is converted to a current signal by means of the photodiode 25, and then converted to a voltage signal by means of the preamplifier 20. The preamplifier 20 may be of any of the configurations shown in FIGS. 1, 2, 3, 5, and 7.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention that fall within the true spirit and scope of the invention.

What is claimed is:

1. A preamplifier for optical receivers having an input terminal and an output terminal for converting a current signal input via the input terminal to a voltage signal and outputting the voltage signal via the output terminal, the preamplifier comprising an inverting amplifier, a feedback resistor, a first transistor, a second transistor, a first load member, a second load member, and a first bias member, wherein an input of the inverting amplifier is connected to the input terminal, an output of the inverting amplifier is connected to a gate of the first transistor, a source of the first transistor and a source of the second transistor are connected to the first bias member, a drain of the first transistor and a gate of the second transistor are connected to the first load member, a drain of the second transistor is connected to the second load member and the output terminal, and the feedback resistor is connected between the input terminal and the output terminal.

2. The preamplifier of claim 1, wherein each of the first and second load members is a transistor of which a drain and gate are connected with each other.

3. The preamplifier of claim 1, wherein the first bias member is a constant current source.

4. The preamplifier of claim 1, wherein the first bias member is a transistor of which a drain and gate are connected with each other.

5. The preamplifier of claim 1, further comprising a second bias member, wherein the second bias member is connected to the first load member.

6. The preamplifier of claim 5, wherein the second bias member is a constant current source.

7. The preamplifier of claim 5, wherein the second bias member is a transistor of which a drain and gate are connected with each other.

8. The preamplifier of claim 1, further comprising a shunting transistor having a gate connected to the output of the inverting amplifier and a source connected to the input terminal.

9. The preamplifier of claim 1, further comprising a shunting transistor having a gate connected to the output terminal and a source connected to the input terminal.

10. The preamplifier of claim 1, further comprising: a shunting transistor connected in parallel with the inverting amplifier between the input and output of the inverting amplifier; and a peak detection circuit, wherein an input of the peak detection circuit is connected to the output terminal, and an output of the peak detection circuit is connected to a gate of the shunting transistor.

11. The preamplifier of claim 1, wherein the inverting amplifier includes third and fourth transistors having a first polarity, a fifth transistor having a second polarity, and a third load member, gates of the third and fifth transistors are connected to the input terminal, drains of the third and fifth transistors are connected to a source of the fourth transistor of which a gate receives a predetermined voltage, and a drain of the fourth transistor is connected to the third load member and the gate of the first transistor.

12. The preamplifier of claim 11, wherein the inverting amplifier further includes a level shift circuit, and an input of the level shift circuit is connected to the input terminal, and an output of the level shift circuit is connected to the gate of the third transistor.

13. The preamplifier of claim 12, wherein the level shift circuit is a source follower.

14. The preamplifier of claim 11, wherein the third load member is a transistor of which a drain and gate are connected with each other.

15. The preamplifier of claim 1, wherein the feedback resistor is composed of transistors.

16. The preamplifier of claim 1, wherein a buffer circuit is connected to the output terminal.

17. An optical communication unit comprising an optical fiber and an optical receiver section, the optical receiver section comprising:

a photodiode for converting an optical signal from the optical fiber to a current signal; and a preamplifier for optical receivers for converting the current signal to a voltage signal, the preamplifier having an input terminal and an output terminal for converting the current signal input via the input terminal to a voltage signal and outputting the voltage signal via the output terminal, the preamplifier including an inverting amplifier, a feedback resistor, a first transistor, a second transistor, a first load member, a second load member, and a first bias member, wherein an input of the inverting amplifier is connected to the input terminal, an output of the inverting amplifier is connected to a gate of the first transistor, a source of the first transistor and a source of the second transistor are connected to the first bias member, a drain of the first transistor and a gate of the second transistor are connected to the first load member, a drain of the second transistor is connected to the second load member and the output terminal, and the feedback resistor is connected between the input terminal and the output terminal.

18. An optical detector for detecting light, comprising:

a photodiode for converting a received optical signal to a current signal; and a preamplifier for converting the current signal to a voltage signal, the preamplifier having an input terminal and an output terminal for converting the current signal input via the input terminal to a voltage signal and outputting the voltage signal via the output terminal, the preamplifier including an inverting amplifier, a feedback resistor, a first transistor, a second transistor, a first load member, a second load member, and a first bias member, wherein an input of the inverting amplifier is connected to the input terminal, an output of the inverting amplifier is connected to a gate of the first transistor, a source of the first transistor and a source of the second transistor are connected to the first bias member, a drain of the first transistor and a gate of the second transistor are connected to the first load member, a drain of the second transistor is connected to the second load member and the output terminal, and the feedback resistor is connected between the input terminal and the output terminal.

* * * * *